United States Patent
Sandhu et al.

(10) Patent No.: US 7,241,661 B2
(45) Date of Patent: Jul. 10, 2007

(54) METHOD OF FORMING A COUPLING DIELECTRIC TA$_2$O$_5$ IN A MEMORY DEVICE

(75) Inventors: Sukesh Sandhu, Boise, ID (US); Dan Gealy, Kuna, ID (US); Gurtej Singh Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/716,765

(22) Filed: Nov. 19, 2003

(65) Prior Publication Data

US 2004/0102002 A1    May 27, 2004

Related U.S. Application Data

(63) Continuation of application No. 09/516,681, filed on Mar. 1, 2000, now Pat. No. 6,677,640.

(51) Int. Cl.
*H01L 21/8242* (2006.01)

(52) U.S. Cl. .................. 438/261; 438/3; 438/104; 438/240

(58) Field of Classification Search ............. 438/261, 438/3, 240, 104, 396, 253
See application file for complete search history.

(56) References Cited

U.S. PATENT DOCUMENTS

| | | | |
|---|---|---|---|
| 4,163,985 A | 8/1979 | Schuermeyer et al. ......... 357/23 |
| 4,630,086 A | 12/1986 | Sato et al. .................. 357/23.5 |
| 4,697,330 A | 10/1987 | Paterson et al. .............. 437/42 |
| 5,063,431 A | 11/1991 | Ohshima .................... 357/54 |
| 5,082,797 A | 1/1992 | Chan et al. |
| 5,223,451 A | 6/1993 | Uemura et al. ............. 437/154 |
| 5,304,829 A | 4/1994 | Mori et al. .................. 257/324 |
| 5,438,012 A * | 8/1995 | Kamiyama .................. 438/396 |
| 5,445,981 A | 8/1995 | Lee .............................. 437/43 |
| 5,504,021 A | 4/1996 | Hong et al. ................... 437/42 |
| 5,508,221 A * | 4/1996 | Kamiyama .................. 438/396 |
| 5,557,122 A | 9/1996 | Shrivastava et al. ......... 257/309 |
| 5,641,702 A * | 6/1997 | Imai et al. .................. 438/396 |
| 5,688,724 A * | 11/1997 | Yoon et al. .................. 438/778 |
| 5,712,208 A * | 1/1998 | Tseng et al. ................. 438/770 |
| 5,717,635 A | 2/1998 | Akatsu ................... 365/185.05 |
| 5,780,891 A | 7/1998 | Kauffman et al. ........... 257/316 |
| 5,907,183 A | 5/1999 | Takeuchi .................... 257/640 |
| 5,949,117 A | 9/1999 | Sandhu et al. .............. 257/410 |
| 6,031,263 A | 2/2000 | Forbes et al. ............... 257/315 |
| 6,087,219 A | 7/2000 | Hsu et al. ................... 438/257 |
| 6,090,670 A | 7/2000 | Sandhu et al. .............. 438/286 |
| 6,156,600 A * | 12/2000 | Chao et al. .................. 438/238 |

(Continued)

FOREIGN PATENT DOCUMENTS

JP          63-252482        10/1988

(Continued)

*Primary Examiner*—Thanh Nguyen
(74) *Attorney, Agent, or Firm*—Schwegman, Lundberg, Woessner & Kluth, P.A.

(57) ABSTRACT

A method of forming a coupling dielectric in a memory cell includes forming an oxide on a substrate, forming Ta$_2$O$_5$ on the oxide, oxidizing the Ta$_2$O$_5$ with rapid thermal process (RTP) at a temperature above the crystallization temperature for Ta$_2$O$_5$, forming a cell nitride on the oxidized Ta$_2$O$_5$, and forming a wetgate oxide on the cell nitride.

35 Claims, 2 Drawing Sheets

U.S. PATENT DOCUMENTS

| | | | |
|---|---|---|---|
| 6,163,049 A | 12/2000 | Bui | 257/321 |
| 6,245,606 B1 | 6/2001 | Wilk et al. | 438/216 |
| 6,251,720 B1 | 6/2001 | Thakur et al. | |
| 6,417,537 B1 | 7/2002 | Yang et al. | |
| 6,461,982 B2 | 10/2002 | DeBoer et al. | |
| 6,617,250 B2 | 9/2003 | Basceri et al. | |
| 6,664,583 B2 | 12/2003 | Yang et al. | |
| 6,664,584 B2 | 12/2003 | Yang et al. | |
| 6,828,191 B1 * | 12/2004 | Wurster et al. | 438/247 |
| 2006/0246655 A1 | 11/2006 | Sandhu et al. | |

FOREIGN PATENT DOCUMENTS

| | | |
|---|---|---|
| JP | 04-206777 | 7/1992 |

* cited by examiner

METHOD OF FORMING A COUPLING DIELECTRIC TA$_2$O$_5$ IN A MEMORY DEVICE

This application is a Continuation of U.S. application Ser. No. 09/516,681, filed Mar. 1, 2000, now U.S. Pat. No. 6,677,640, which is incorporated herein by reference.

FIELD OF THE INVENTION

This invention relates to information storage, and more particularly to solid state memory used in information storage systems.

BACKGROUND OF THE INVENTION

A modern information storage system should acquire information quickly, maintain the information with integrity over time, and provide for the quick and accurate retrieval and erasing of the information. As the demand for miniature hand held communication and other data processing devices increases, the demand for smaller nonvolatile data storage devices increases. A flash memory device, such as erasable programmable read only memory (EPROM) or an electrically erasable programmable read only memory (EEPROM), is one type of information storage device used in modern nonvolatile information storage systems.

FIG. 1 is a cross-sectional view of a prior art flash memory cell 100. Flash memory cell 100 includes substrate 103, source region 106, drain region 109, channel 112, oxide 115, floating gate 118, dielectric layer 121, and control gate 124. Dielectric layer 121 comprises a three layer oxide-nitride-oxide dielectric.

In flash memory cell 100, information is stored on floating gate 118 as electronic charge. To facilitate the quick acquisition of information in flash memory cell 100, the cell is designed to have a large capacitance between control gate 124 and the floating gate 118. As the density of memory cells in a solid state memory is increased by scaling the physical dimensions of the cells, the area of floating gate 118 is decreased, which decreases the capacitance and coupling between control gate 124 and floating gate 118. Unfortunately, this decrease in coupling reduces the electric field between the substrate and the floating gate during a write operation. A decrease in the electric field decreases the rate at which hot electrons flowing in channel 112 are injected onto floating gate 118 and increases the time to store charge on the floating gate 118.

Information must be retained in flash memory cell 100 on floating gate 118 for a long period of time. As described above, as flash memory cells are scaled, the area of the floating gate in each cell is decreased and the capacitance between the floating gate and the control gate is decreased. A smaller capacitance results in less charge being injected into the floating gate. For a particular leakage current, a memory cell having less stored charge loses its information more quickly than a memory cell having more stored charge. One solution to this problem is to substitute a material having a high dielectric constant for dielectric 121 in flash memory cell 100. Unfortunately, materials that have a high dielectric constant and are compatible with integrated circuit manufacturing processes often have a high leakage current, which decreases the storage lifetime of the stored information for a fixed amount of charge.

Quick and accurate retrieval of information from flash memory cell 100 requires accurately sensing the charge stored on floating gate 118. A large amount of stored charge provides a signal that is easier to accurately sense than a small amount of stored charge. A large amount of stored charge also decreases the read time at the sensing device. Unfortunately, as devices are scaled to a small fraction of a micron, and the operating voltages are reduced, the charge on floating gate 118 is often decreased, thus making the quick and accurate retrieval of information more difficult. Flash memories already operate with relatively little stored charge, so as the stored charge is decreased further by scaling the physical dimensions of a memory cell, there is an increase in the number of errors at the sense amplifier when reading information from the scaled flash memory cell 100.

For these and other reasons there is a need for the present invention.

SUMMARY OF THE INVENTION

The above mentioned problems with flash memory cells and other problems are addressed by the present invention and will be understood by reading and studying the following specification.

A memory cell or nonvolatile memory cell having a dielectric sandwich, insulating sandwich, or coupling dielectric that is capable of increasing the coupling in the memory cell is disclosed. The dielectric sandwich is thin and has at least one high permittivity layer having a thickness of between about 140 and 240 angstroms. The dielectric sandwich also has at least one oxide layer formed at a temperature above the crystallization temperature of the high permittivity layer. In the flash memory cell, the dielectric sandwich is located between the control gate and the floating gate and provides for tight coupling between the control gate and the floating gate.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
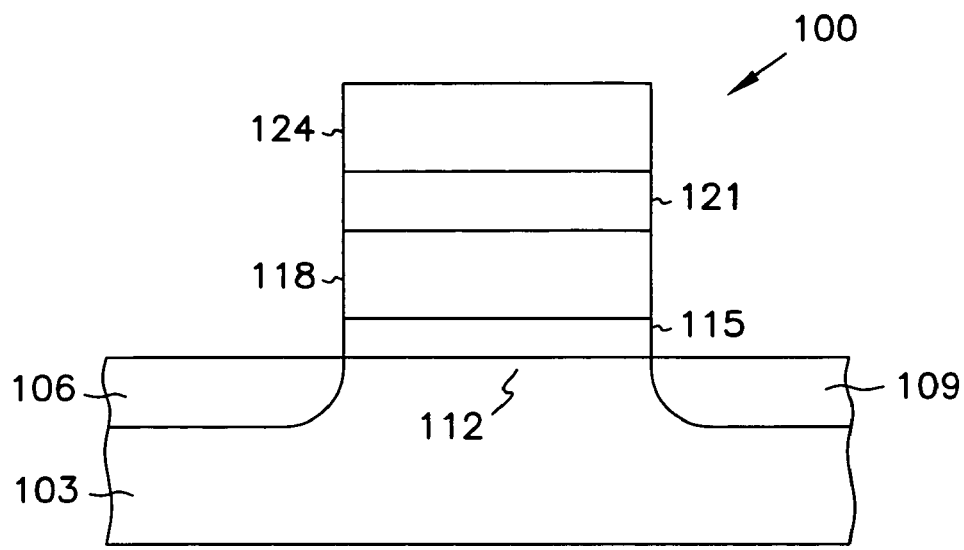
FIG. 1 is a cross-sectional view of a prior art flash memory device.
Figure 2:
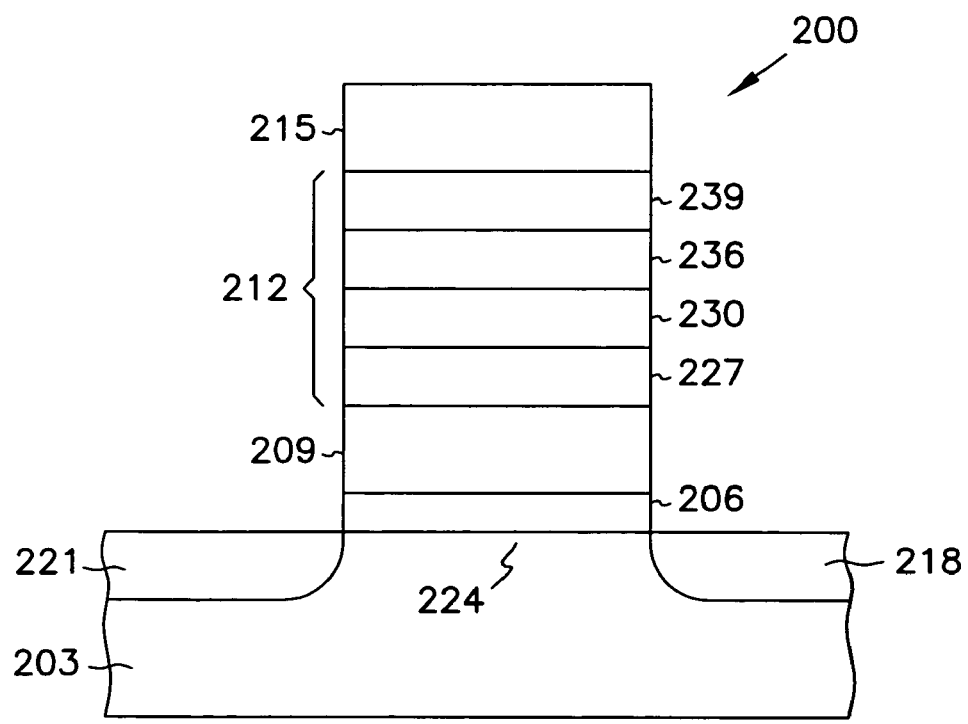
FIG. 2 is a cross-sectional view of some embodiments of a flash memory device of the present invention.

FIG. 2 is a cross-sectional view of some embodiments of memory cell 200 of the present invention. Memory cell 200 comprises substrate 203, insulator 206, floating gate 209, dielectric sandwich 212, and control gate 215.

Substrate 203, in one embodiment, is a semiconductor, such as germanium or silicon. Alternatively, substrate 203 is gallium arsenide, silicon-on-sapphire, or any other crystalline or amorphous material suitable for use as a substrate in the manufacture of integrated circuits. Substrate 203, in one embodiment, is fabricated from an n-type silicon having a pair of spaced apart p+ source 218 and p+ drain 221 regions. Channel 224 is located between source 218 and drain 221 regions.

Insulator 206 is formed above substrate 203 and has thickness of less than 1000 angstroms. Increasing the thickness of insulator 203 above 1000 angstroms decreases the capacitance between the floating gate and the substrate and between the control gate and the substrate, which increases the time to store charge on the floating gate. In one embodiment, insulator 206 is a thermal oxide, such as silicon oxide, formed by oxidizing substrate 203. The present invention is not limited to a particular form of silicon oxide. Both SiO and $SiO_2$ are suitable for use in connection with the present invention.

Floating gate 209 is formed above insulator 206. In one embodiment, floating gate 209 is polysilicon, and is deposited using a chemical vapor deposition (CVD) process or other suitable process to a thickness of about 2000 angstroms. Floating gate 209, in one embodiment, is doped to a desired level by diffusing phosphorous into the polysilicon.

Dielectric sandwich 212 is formed above floating gate 209. Dielectric sandwich 212 comprises a plurality of layers. In one embodiment, dielectric sandwich 212 comprises four layers including oxide layer 227, tantalum oxide layer 230, cell nitride layer 236, and wetgate oxide layer 239.

Oxide layer 227 is formed above floating gate 209. In one embodiment, oxide layer 227 is $SiO_2$ thermally grown to a thickness of between about 28 angstroms and 32 angstroms on floating gate 209. A thickness of less than about 23 angstroms increases the charge leakage in the dielectric sandwich and a thickness of greater than about 32 angstroms unnecessarily decreases the capacitance of dielectric sandwich 212. Alternatively, oxide layer 227 may be formed on floating gate 209 by chemical vapor deposition (CVD). Forming oxide layer 227 by CVD permits floating gate 209 to have a higher doping level than growing oxide layer 227 thermally.

Tantalum oxide layer 230 is formed above oxide layer 227. In one embodiment, tantalum oxide layer 230 is tantalum pentoxide, $Ta_2O_5$, deposited by metal organic chemical vapor deposition (MOCVD) to a thickness of between 60 and 100 angstroms. A thickness of greater than 100 angstroms decreases the capacitance of the dielectric sandwich, which degrades the performance of the memory cell during a charging operation. A thickness of less than about 60 angstroms increases the charge leakage in dielectric sandwich 212. Other high dielectric materials or high permittivity materials having a permittivity of between ten and twelve are also suitable for use in connection with the present invention. For example, $Al_2O_3$ is suitable for use in connection with the present invention. An advantage of employing a high dielectric material, such as tantalum oxide, in dielectric sandwich 212 is that the coupling between the control gate and the floating gate is increased, and increased coupling allows faster charging of floating gate 209 by creating a stronger field and faster charging of floating gate 209 during a write operation.

Tantalum oxide layer 230, in one embodiment, is reoxidized by rapid thermal processing (RTP) at a temperature of between about 400 degrees centigrade and about 900 degrees centigrade. In one embodiment, tantalum is oxidized above the crystallization temperature. In an alternate embodiment, where subsequent processing occurs at temperatures above 750 degrees centigrade, an amorphous tantalum oxide can be used, and reoxidation, in this embodiment, is kept below about 725 degrees centigrade. An advantage of reoxidizing the tantalum oxide layer is that reoxidizing typically reduces leakage.

Cell nitride layer 236 is formed above tantalum oxide layer 230. In one embodiment, cell nitride layer 236 is $Si_3N_4$ and has a thickness of between about 40 and 60 angstroms. A thickness of less than about 40 angstroms increases charge leakage in dielectric sandwich 212 and a thickness of more than about 60 angstroms unnecessarily decreases the capacitance of dielectric sandwich 212. Capacitor uniformity across the memory cell is dependent on the uniformity of nitride layer 236. Low pressure chemical vapor deposition is one method of depositing cell nitride layer 236.

Wetgate oxide layer 239 is formed above cell nitride layer 236. In one embodiment, wetgate oxide layer 239 is $SiO_2$ and has a thickness of between about 10 and 50 angstroms.

Control gate 215 is formed above dielectric sandwich 212. Control gate 215 is formed from polysilicon. Control gate 215 may include other conductive materials, such as aluminum, and is deposited to a depth of about 2000 angstroms. Control gate 215 is doped to the desired level through phosphorous diffusion.

Dielectric sandwich 212, as shown in FIG. 2, is formed between floating gate 209 and control gate 215 for use in connection with flash memory cell 200. However, dielectric sandwich 212 is not limited to use in a particular integrated circuit structural configuration. Dielectric sandwich 212 is useful in connection with any integrated circuit device that benefits from a dielectric composite that has a high capacitance value, a low leakage value, and is formed using conventional integrated circuit processing methods. Dielectric sandwich 212 my also be referred to as a floating gate coupling dielectric.

Memory cell 200, in one embodiment of the present invention, has a gate dimension area of about 1 micron. To charge flash memory cell 200 having a gate dimension of about 1 micron, about 12 volts is applied to the control gate, and a pulse voltage of about 5 volts is applied between source 218 and the drain 221 regions. The width of the pulse voltage is selected to provide an amount of charge to floating gate 209 that generates a strong signal to the memory cell sense amplifier.

To summarize, in accordance with the present invention, the plurality of dielectric layers or dielectric sandwich 212 formed above floating gate 209 has a thickness greater than about 140 angstroms. The reason for fabricating a thin dielectric sandwich is to provide a large capacitance value between control gate 215 and the floating gate 209. A large capacitance value is desirable because it permits flash memory cell 200 to be scaled and to operate with a smaller control gate voltage and a smaller floating gate area, which facilitates the quick acquisition of charge, and the long term storage and accurate sensing of charge on floating gate 209. Dielectric sandwich 212, in one embodiment, has a permittivity of between ten and twelve. Again, having a dielectric with a permittivity of between ten and twelve between control gate 215 and floating gate 209 permits the use of a lower gate voltage and a smaller cell size having a smaller floating gate area. In an alternate embodiment, the insulating sandwich has a thickness of between 140 angstroms and 240 angstroms and has a capacitance of 25% to 35% greater than an oxide-nitrideoxide insulator having a thickness of between 140 angstroms and 240 angstroms.

Figure 3:
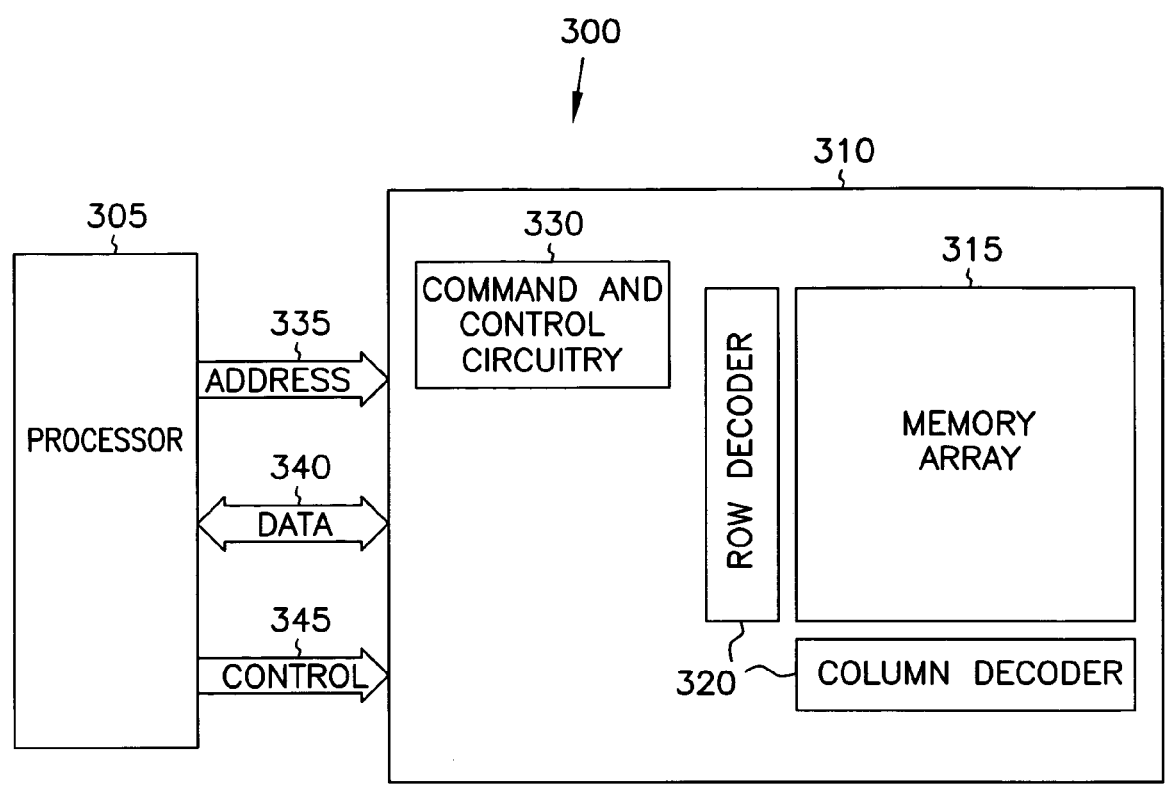
FIG. 3 is a block diagram of a system level embodiment of the present invention.

Referring to FIG. 3, a block diagram of a system level embodiment of the present invention is shown. System 300 comprises processor 305 and memory device 310, which includes memory cells of one or more of the types described above in conjunction with FIG. 2. Memory device 310 comprises memory array 315, address circuitry 320, and read circuitry 330, and is coupled to processor 305 by address bus 335, data bus 340, and control bus 345. Processor 305, through address bus 335, data bus 340, and control bus 345 communicates with memory device 310. In a read operation initiated by processor 305, address information, data information, and control information are provided to memory device 310 through busses 335, 340, and 345. This information is decoded by addressing circuitry 320, including a row decoder and a column decoder, and read circuitry 330. Successful completion of the read operation results in information from memory array 315 being communicated to processor 305 over data bus 340.

CONCLUSION

An embodiment of a nonvolatile memory cell has been described which has a high dielectric constant sandwich located between the control gate and the floating gate. The high dielectric constant sandwich also exhibits low charge leakage. A method of fabricating the nonvolatile memory cell has also been described.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of forming a coupling dielectric in a memory cell comprising:
    forming a dielectric stack, wherein forming the dielectric stack includes:
        forming an oxide on a substrate;
        forming $Ta_2O_5$ on the oxide;
        oxidizing the $Ta_2O_5$ with rapid thermal process (RTP) at a temperature above the crystallization temperature for $Ta_2O_5$;
        forming a cell nitride on the oxidized $Ta_2O_5$;
        forming a wetgate oxide on the cell nitride; and
    forming the dielectric stack to a thickness of between 140 angstroms and 240 angstroms.

2. The method of claim 1, wherein oxidizing the $Ta_2O_5$ with rapid thermal process (RTP) at the temperature above the crystallization temperature for $Ta_2O_5$ comprises:
    oxidizing the $Ta_2O_5$ with rapid thermal process (RTP) in $N_2O$ at a temperature of between about 750 degrees centigrade and about 900 degrees centigrade.

3. The method of claim 2, further comprising cooling for between about 55 seconds and about 65 seconds after oxidizing the $Ta_2O_5$.

4. A method of claim 1, wherein forming the dielectric stack comprises forming the dielectric stack tohave a capacitance of at least 25% greater than an oxide-nitride-oxide insulator having a thickness of between 140 and 240 angstroms.

5. A method of forming a coupling dielectric in a memory cell comprising:
    forming a dielectric stack, wherein forming the dielectric stack includes:
        forming an oxide on a substrate to a depth of about 30 angstroms;
        forming a tantalum oxide having a crystallization temperature on the oxide to a depth of between about 60 angstroms and about 100 angstroms;
        oxidizing the tantalum oxide with rapid thermal processing (RTP) at a temperature above the crystallization temperature of tantalum oxide;
        forming a cell nitride on the oxidized tantalum oxide to a depth of between about 40 angstroms and about 60 angstroms;
        forming a wetgate oxide to a depth of between about 10 angstroms and about 50 angstroms on the cell nitride; and
    forming the dielectric stack to a thickness of between 140 angstroms and 240 angstroms.

6. The method of claim 5, wherein forming the tantalum oxide on the oxide to the depth of between about 60 angstroms and about 100 angstroms comprises:
    forming $Ta_2O_5$ on the oxide to a depth of between about 60 angstroms and about 100 angstroms.

7. The method of claim 6, further comprising oxidizing the tantalum oxide in rapid thermal processing (RTP) in $N_2O$ for about 60 seconds.

8. The method of claim 5, wherein forming the dielectric stack comprises forming the dielectric stack to have a capacitance of at least 25% greater than an oxide-nitride-oxide insulator having a similar thickness compared to the dielectric stack.

9. A method of forming a coupling dielectric in a memory cell comprising:
    forming a dielectric stack, wherein forming the dielectric stack includes:
        forming a layer of $SiO_2$ on a substrate;
        forming a layer of $Ta_2O_5$ on the layer of $SiO_2$;
        oxidizing the $Ta_2O_5$ with rapid thermal processing (RTP);
        forming a layer of $Si_3N_4$ on the layer of $Ta_2O_5$;
        forming a wetgate oxide layer of $SiO_2$ on the layer of $Si_3N_4$;
    forming the dielectric stack to a thickness of between 140 angstroms and 240 angstroms; and
    forming the dielectric stack to have a capacitance of at least 25% greater than an oxide-nitride-oxide insulator having a thickness of between 140 angstroms and 240 angstroms.

10. The method of claim 9, wherein forming the layer of $SiO_2$ on the substrate comprises forming the layer of $SiO_2$ on germanium.

11. The method of claim 10, wherein forming the layer of $Ta_2O_5$ on the layer of $SiO_2$ comprises oxidizing the tantalum oxide layer above the crystallization temperature.

12. A method of forming a coupling dielectric in a memory cell comprising:
    forming a dielectric stack, wherein forming the dielectric stack includes:
        forming an oxide layer on a substrate;
        forming a tantalum oxide on the oxide layer;
        oxidizing the tantalum oxide with rapid thermal processing (RTP);
        forming a nitride layer on the tantalum oxide layer; and
        forming a wetgate oxide on the nitride layer such that the dielectric stack has a thickness of between about 140 angstroms and 240 angstroms.

13. The method of claim 12, wherein forming the oxide layer on the substrate comprises forming the oxide layer on gallium arsenide.

14. The method of claim 12, wherein forming the tantalum oxide layer on the oxide layer comprises oxidizing the tantalum oxide layer above the crystallization temperature.

15. The method of claim 12, wherein forming the dielectric stack comprises forming the dielectric stack having a capacitance of 25% to 35% greater than an oxide-nitride-oxide insulator with a thickness of between 140 angstroms and 240 angstroms.

16. A method of forming a coupling dielectric in a memory cell, comprising:
   forming a dielectric stack, wherein forming the dielectric stack includes:
      forming a thermally grown oxide layer having a thickness of between about 28 angstroms and about 32 angstroms on a substrate;
      forming a tantalum oxide layer on the thermally grown oxide layer;
      oxidizing the tantalum oxide layer with rapid thermal processing (RTP);
      forming a nitride layer on the tantalum oxide layer;
      forming a wetgate oxide layer on the nitride layer; and
   forming the dielectric stack to a thickness of between 140 angstroms and 240 angstroms.

17. The method of claim 16, wherein forming the thermally grown oxide layer having a thickness of between about 28 angstroms and about 32 angstroms on the substrate comprises forming the thermally grown oxide layer on a silicon-on-sapphire substrate.

18. The method of claim 16, wherein forming the tantalum oxide layer on the thermally grown oxide layer comprises reoxidizing the tantalum oxide layer above the crystallization temperature of the tantalum oxide layer.

19. The method of claim 16, wherein the dielectric stack has a capacitance of at least 25% greater than an oxide-nitride-oxide insulator having a thickness of between 140 angstroms and 240 angstroms.

20. A method of forming a coupling dielectric in a memory cell, comprising:
   forming a dielectric stack, wherein forming the dielectric stack includes:
      forming a oxide layer on a substrate;
      forming a tantalum oxide layer by metal organic chemical vapor deposition to a thickness of between about 60 angstroms and about 100 angstroms on the oxide layer;
      oxidizing the tantalum oxide layer with rapid thermal processing (RTP);
      forming a nitride layer on the tantalum oxide layer;
      forming a wetgate oxide layer on the nitride layer; and
   forming the dielectric stack to a thickness of between 140 angstroms and 240 angstroms.

21. The method of claim 20, wherein forming the oxide layer on the substrate comprises forming the oxide layer on an amorphous material.

22. The method of claim 20, wherein forming the oxide layer on the substrate comprises forming the oxide layer by chemical vapor deposition.

23. The method of claim 20, wherein forming the dielectric stack providing a capacitance for the dielectric stack of 25% to 35% more when compared to an oxide-nitride-oxide insulator having a thickness of between 140 angstroms and 240 angstroms.

24. A method of forming a coupling dielectric in a memory cell, comprising:
   forming a dielectric stack, wherein forming the dielectric stack includes:
      forming an oxide layer on a substrate;
      forming a layer of a material having a permittivity of between about ten and about twelve on the oxide layer;
      forming a nitride layer on the tantalum oxide layer;
      forming a wetgate oxide layer on the nitride layer; and
   forming the dielectric stack to a thickness of between 140 angstroms and 240 angstroms.

25. The method of claim 24, wherein forming the oxide layer on the substrate comprises forming the oxide layer on a n+ substrate.

26. The method of claim 24, wherein forming the oxide layer on the substrate comprises forming the oxide layer by chemical vapor deposition.

27. The method of claim 24, wherein forming the dielectric stack has a capacitance of the dielectric stack of at least 25% greater than an oxide-nitride-oxide insulator having a thickness of between 140 angstroms and 240 angstroms.

28. A method of forming a coupling dielectric in a memory cell, comprising:
   forming a dielectric stack, wherein forming the dielectric stack includes:
      forming an oxide layer on a substrate;
      forming a tantalum oxide layer on the oxide layer;
      oxidizing the tantalum oxide layer with rapid thermal processing (RTP);
      forming a nitride layer having a thickness of between about 40 angstroms and about 60 angstroms on the tantalum oxide layer;
      forming a wetgate oxide layer on the nitride layer; and
   forming the dielectric stack to a thickness of between 140 angstroms and 240 angstroms.

29. The method of claim 28, wherein forming the oxide layer on the substrate comprises forming the oxide layer on a germanium substrate.

30. The method of claim 28, wherein forming the nitride layer having the thickness of between about 40 angstroms and about 60 angstroms on the tantalum oxide layer comprises forming the nitride layer by low pressure chemical vapor deposition.

31. The method of claim 28, wherein the dielectric stack is formed to exhibit much more capacitance compared to an oxide-nitride-oxide insulator having similar thickness.

32. A method of forming a coupling dielectric in a memory cell, comprising:
   forming a dielectric stack to a thickness of between 140 angstroms and 240 angstroms, wherein forming the dielectric stack includes:
      forming an oxide layer on a substrate;
      forming a tantalum oxide layer on the oxide layer;
      oxidizing the tantalum oxide layer with rapid thermal processing (RPT);
      forming a nitride layer on the tantalum oxide layer; and
      forming a wetgate oxide layer having a thickness of between about 10 angstroms and about 50 angstroms on the nitride layer.

33. The method of claim 32, wherein forming the oxide layer on the substrate comprises forming the oxide layer on a silicon substrate.

34. The method of claim 32, wherein forming the oxide layer on the substrate comprises forming the oxide layer on a gallium arsenide substrate.

35. The method of claim 32, wherein forming the dielectric stack has a capacitance value of 25% to 35% larger than an oxide-nitride-oxide insulator with the substantially similar thickness.

* * * * *

UNITED STATES PATENT AND TRADEMARK OFFICE
CERTIFICATE OF CORRECTION

PATENT NO.         : 7,241,661 B2
APPLICATION NO. : 10/716765
DATED              : July 10, 2007
INVENTOR(S)        : Sandhu et al.

It is certified that error appears in the above-identified patent and that said Letters Patent is hereby corrected as shown below:

Column 5, line 54, in Claim 4, delete "A" and insert -- The --, therefor.

Column 5, line 55, in Claim 4, delete "tohave" and insert -- to have --, therefor.

Column 5, line 57, in Claim 4, after "140" insert -- angstroms --.

Column 6, line 49, in Claim 12, after "cell" insert -- , --.

Column 6, line 53, in Claim 12, after "tantalum oxide" insert -- layer --.

Column 6, line 54, in Claim 12, after "tantalum oxide" insert -- layer --.

Column 6, line 58, in Claim 12, after "between" delete "about".

Column 7, line 36, in Claim 20, after "forming" delete "a" and insert -- an --, therefor.

Column 7, line 65, in Claim 24, after "oxide layer;" insert -- oxidizing the layer of a material with rapid thermal processing (RTP); --.

Column 8, line 49 (Approx.), in Claim 32, delete "(RPT):" and insert -- (RTP); --, therefor.

Signed and Sealed this

Eleventh Day of September, 2007

JON W. DUDAS
*Director of the United States Patent and Trademark Office*